US008894828B2

(12) United States Patent
    Makarov

(10) Patent No.: US 8,894,828 B2
(45) Date of Patent: Nov. 25, 2014

(54) FIB PROCESS FOR SELECTIVE AND CLEAN ETCHING OF COPPER

(75) Inventor: Vladimir V. Makarov, Fremont, CA (US)

(73) Assignee: Tiza Lab, LLC, Milpitas, CA (US)

( * ) Notice: Subject to any disclaimer, the term of this patent is extended or adjusted under 35 U.S.C. 154(b) by 96 days.

(21) Appl. No.: 13/504,089

(22) PCT Filed: Aug. 24, 2010

(86) PCT No.: PCT/US2010/046449
    § 371 (c)(1),
    (2), (4) Date: Apr. 25, 2012

(87) PCT Pub. No.: WO2011/025770
    PCT Pub. Date: Mar. 3, 2011

(65) Prior Publication Data
    US 2012/0211356 A1    Aug. 23, 2012

Related U.S. Application Data

(63) Continuation-in-part of application No. 12/727,191, filed on Mar. 18, 2010, now abandoned, which is a continuation-in-part of application No. 12/547,368, filed on Aug. 25, 2009, now abandoned, said application No. PCT/US2010/046449 is a continuation-in-part of application No. 12/547,368, filed on Aug. 25, 2009, now abandoned.

(51) Int. Cl.
    *C23C 14/00*    (2006.01)
    *C23C 14/32*    (2006.01)
    *H01L 21/3213*    (2006.01)
    *H01L 21/768*    (2006.01)
    *C23F 4/00*    (2006.01)

(52) U.S. Cl.
    CPC ............ *C23F 4/00* (2013.01); *H01L 21/32136* (2013.01); *H01L 21/76892* (2013.01)
    USPC .............. 204/192.34; 204/192.35; 204/192.37

(58) Field of Classification Search
    USPC ........................ 204/192.34, 192.35, 192.37
    See application file for complete search history.

(56) References Cited

U.S. PATENT DOCUMENTS

| 6,103,680 | A * | 8/2000 | Honda et al. ............. 510/178 |
| 6,218,022 | B1 * | 4/2001 | Suzuki et al. ............ 428/457 |
| 7,060,196 | B2 * | 6/2006 | Makarov et al. ........... 216/63 |
| 7,083,741 | B2 * | 8/2006 | Stadler et al. ............. 216/93 |

* cited by examiner

*Primary Examiner* — Keith Hendricks
*Assistant Examiner* — Ibrahime A Abraham
(74) *Attorney, Agent, or Firm* — Barry N. Young

(57) ABSTRACT

Etch assisting agents for focused ion beam (FIB) etching of copper for circuit editing of integrated circuits both prevent loss of adjacent dielectric due to sputtering by the ion beam, and render sputtered re-deposited copper on adjacent surfaces non-conductive to avoid electrical short circuits. The agents are characterized by having an N—N (N being Nitrogen) bonding in their molecules and boiling points between about 70° C. and about 220° C., and include hydrazine and water solutions, hydrazine derivatives, NitrosAmine derivatives saturated with two hydrocarbon groups selected from Methyl, Ethyl, Propyl and Butyl, NitrosAmine related compounds, and Nitrogen Tetroxide. Preferred agents are Hydrazine monohydrate (HMH), HydroxyEthylHydrazine (HEH), CEH, BocMH, BocMEH, NDMA, NDEA, NMEA, NMPA, NEPA, NDPA, NMBA, NEBA, NPYR, NPIP, NMOR and Carmustine, alone or in combination with Nitrogen Tetroxide. The agents are effective for etching copper in high aspect ratio (deep) holes.

18 Claims, 4 Drawing Sheets

FIB PROCESS FOR SELECTIVE AND CLEAN ETCHING OF COPPER

FIELD OF THE INVENTION

This invention relates generally to focused ion beam etching of copper and copper materials, and more particularly to the chemically-assisted etching of copper over dielectric materials.

BACKGROUND

Copper (Cu) is the primary material used in integrated circuits (ICs) to create electrically conductive interconnects, and the etching of copper in ICs using focused ion beam (FIB) techniques is important in the field of circuit editing (CE) for failure verification and debugging of the ICs. Circuit editing of ICs with a focused-ion-beam (FIB) system requires that copper planes and traces be milled (cut) uniformly and cleanly so as to electrically isolate circuit elements across the separation created.

Achieving clean uniform FIB etching of copper for CE is difficult. In spite of significant past efforts to improve the quality of FIB copper etching processes, problems persist and improvements are needed in two main areas. These two areas are reducing electrically conductive re-deposited copper in the FIB etching area, and improving the etching selectivity and removal of copper while protecting the adjacent and underlying dielectric from unwanted etching and removal. Both of these problems arise from the properties of copper.

In contrast to aluminum (Al) that may be removed quickly and cleanly in a FIB operation using an agent such as iodine or an iodine-containing etchant, copper does not create simple volatile compounds with iodine or any other elements as does aluminum (e.g., $AlI_3$) that can survive under ion bombardment and are easily removed. Rather, copper etching in a FIB process is due substantially exclusively to ion beam sputtering. This can inevitably lead to the unwanted re-deposition of conductive copper which causes problems as discussed below.

In addition, copper has a crystalline structure comprising crystal grains which have different crystallographic orientations. Grains with different orientations exhibit significantly different FIB etching rates and, therefore, FIB etching of copper is very non-uniform and uneven. It results in a very rough surface on the etched copper, and may perforate the copper layer down to the underlying dielectric. This may lead to significant damage of the underlying dielectric, and may result in electrical short circuiting of IC circuits from re-deposited electrically conductive copper. Past efforts to improving selectivity have focused principally on protecting the dielectric rather than enhancing the removal of copper, because the required selectivity that is achievable for copper etching is low relative to other materials, e.g., aluminum, where volatile etching byproducts are created.

Further, the ion beam sputtering process causes copper re-deposition all about the area exposed by the ion beam. This creates significant problems since the milled copper material that is intended to be removed re-deposits in this area, making electrical isolation of a signal difficult or impossible. In addition to affording protection of the adjacent and underlying dielectric against unwanted damage or removal, copper etch-assisting chemical agents must also actively assist in either limiting re-deposition of conductive copper material or converting re-deposited conductive copper to a non-conductive state to prevent unwanted electrical short circuits and ensure disconnection of copper conductors intended to be disconnected. FIG. 1 shows two comparative examples of FIB operations to cut copper lines using straight sputtering by an ion beam without any etch assisting agent (top trace A), and ion beam sputtering in an atmosphere of $NH_4OH$ comprising a mixture of oxidizing vapors of ammonia ($NH_3$) and water ($H_2O$) (bottom trace B). In the figures, copper appears as the bright areas. The different shades of brightness (gray to white) in the copper lines represent areas of different grain orientations that were etched differently.

In the top example A of FIG. 1, the re-deposited conductive copper is clearly seen as the thin bright lines 10, 11 on opposite sides of the severed copper line 12, demonstrating that electrical disconnection was not complete, i.e. there was no voltage difference between disconnected ends of the copper line. On the other hand, as shown in the bottom example B in the figure, the copper line 14 was successfully cut and the two ends of the line were disconnected electrically. The re-deposited conductive copper was oxidized by the vapors of $NH_3$ and $H_2O$, rendering it nonconductive and a voltage potential difference was present between the disconnected ends of the copper line. This example shows the advantages of using chemical oxidizers, such as electro-negative chemical elements like oxygen and nitrogen, as FIB etching agents for copper.

However, not all oxidizing agents will work with copper. For example, halogens should not be used as etch-assisting agents. Halogens, with the exception of fluorine, spontaneously react with and corrode copper without any activation by an ion beam, and they seriously degrade the conductivity of the copper. Even if halogen agents such as chlorine, bromine and iodine are carefully controlled, they can remain in the FIB vacuum chamber for a long time and continue to corrode any exposed copper. Furthermore, all halogens (including fluorine) are very aggressive to both high-k and low-k dielectrics.

When etching copper, there should be reasonably small and controlled over-etching of the dielectric so that performing CE on one metallization layer does not break through to an adjacent or underlying layer and create electrical leakage. Moreover, if cutting a copper line on a plane is not the last operation in the CE process, steps should be taken to ensure that the dielectric floor is flat after copper removal. Otherwise, subsequent operations can be seriously affected. As noted previously, because of its crystalline structure, the sputtering rate of copper is highly dependent on its grain orientation, and the average etching rate can vary significantly, as by a factor of four or more for a given set of FIB operating parameters. This is illustrated in FIG. 2 that shows the results of straight sputtering of copper 20 without any etch assisting chemistry applied, and clearly demonstrates the very uneven sputtering of copper due to its crystallographic structure. The dimensions of the milled area in the figure are approximately 10 μm×10 μm. As shown, the underlying dielectric is heavily damaged in areas where the copper removal was the greatest, while in other areas significant amounts of copper remain to be removed. From this figure, the difficulties in controlling the etching of copper may be readily appreciated.

Since copper removal is due to ion beam sputtering (not volatilization), copper removal occurs relatively slowly. This means that it is necessary to expose the copper to the ion beam for a longer period of time, and because of the unevenness of copper removal the ion beam may inadvertently damage some spots of the underlying dielectric. Thus, any copper etch assisting agent must provide protection of the adjacent or underlying dielectric to prevent unwanted etching of the dielectric. Once an area of dielectric is exposed, the etch assisting agent should either halt or significantly slow down the dielectric sputtering.

For conventional dielectrics, such as silicon dioxide, $SiO_2$, it has been found that oxygen, water or a mixture of vapors of water and ammonia can slow down dielectric sputtering by up to a factor of ten if the ion beam current density and vapor pressure are adjusted properly. Water and ammonia are good oxidizers and have been found to afford reasonably good protection for conventional dielectrics, and oxygen, water and a mixture of water and ammonia have been used as copper etch assisting chemicals for etching copper over conventional $SiO_2$ dielectric. However, these compounds have been found to be useless for protecting the new low-k dielectrics being increasingly used in ICs. The main problem is that many low-k dielectrics contain carbon as one of the main components of the dielectric structure, which is why low-k dielectrics are sometimes called "organic" dielectrics. Both water and oxygen easily oxidize carbon in the dielectric structure to produce carbon monoxide (CO) or carbon dioxide ($CO_2$), both of which are gases and are volatilized. Therefore, rather than being protective agents for the dielectric, they accelerate dielectric etching by volatilizing one of the main components of the dielectric structure.

There has been and is an increasing tendency in the IC industry to employ dielectrics with even lower k numbers by increasing of the proportion of carbon in their structures. This has led to a demand for new copper etch assisting chemistries that are capable of protecting the dielectric. U.S. Pat. No. 7,060,196 discloses and claims a number of chemicals, mainly nitro-compounds such as Nitro-methane, Nitro-ethane, Nitro-propane, Nitro-ethanol and others, for use as etch assisting agents to protect dielectrics in FIB copper etching applications. Nitro-ethanol presently is one of the most widely used chemical agents for etching copper over organic dielectrics in FIB operations. While Nitro-ethanol has been effective in limiting dielectric etching, it has not been very effective addressing the problem of re-deposition of sputtered conductive copper material on surfaces adjacent to the IC work area. This is shown in FIG. 3.

FIG. 3 illustrates the results of etching copper over Black Diamond™ dielectric using Nitro-ethanol as an etch assisting agent. As shown, the center of the milled area has a flat bottom with two rows of contacts 30 comprising vias connected to the next lower layer. However, re-deposited copper is clearly present on the vertical walls of the openings, as indicated at 32. Re-deposited conductive copper material appears as bright areas in the figure as it produces secondary electron emission. The re-deposited material is conductive because it contains copper and some carbon from the copper etch assisting compound (Nitro-ethanol in this case). This re-deposited material may render the IC partially or totally inoperative by electrically short circuiting interconnects or grounding copper power planes. For example, if in the figure the upper milled area 34 were not wider than the lower milled area 36, the top and bottom power planes would be electrically shorted to each other by the re-deposited conductive copper on the vertical walls of the openings. There is also more re-deposited conductive copper material in the milled areas which is invisible in the figure because it is not grounded and does not produce secondary electron emission. From the figure, it can be concluded that while the Nitro-ethanol copper etch assisting compound functions well to protect the underlying dielectric, it is not effective in addressing conductive copper re-deposition.

Thus, there is a need for etching methods and etch assisting agents for FIB etching of copper that addresses the foregoing and other problems with known methods and etch assisting agents. In particular, there is a need for etching methods and etch assisting agents for FIB etching of copper that both protect the adjacent and underlying dielectric from unwanted etching, and that avoid the problems caused by re-deposition of conductive copper and other materials. It is to these ends that the present invention is directed.

SUMMARY OF THE INVENTION

The invention affords FIB copper etching processes and agents that address the foregoing and other known problems of FIB copper etching processes and agents for CE of ICs. In particular, the invention affords FIB copper etch assisting agents that address the two principal problems with known etch assisting agents, i.e., protection of the adjacent dielectric when etching copper, and rendering sputtered and re-deposited conductive copper non-conductive to prevent electrical short circuiting. The etch assisting agents of the invention protect the adjacent dielectric during copper etching by having low volatility which affords high stickiness and long residence time when adsorbed on the dielectric surface, and by being formed of atomic groups that form oxides, nitrides or oxy-nitrides when activated by ion beam, and contribute to the replenishment of dielectric lost by ion beam sputtering. The etch assisting agents additionally afford efficient oxidation of re-deposited copper to convert the sputtered and re-deposited conductive copper to non-conductive copper salts or oxides, nitrides or oxy-nitrides.

In one aspect the invention affords a FIB process and etch assisting agent for etching copper in the presence of a dielectric by a focused ion beam in which the copper and the dielectric are exposed to an etch assisting agent comprising a compound selected from the group hydrazine and hydrazine derivatives, and NitrosAmines having the chemical structure $R_1N(-R_2)-N=O$, where $R_1$ and $R_2$ are linear or branched hydrocarbon groups, and NitrosAmine related compounds having the chemical structure $R_1N(-R_2)-N=O$, where $R_1$ and $R_2$ are linear or branched hydrocarbon or halogenated hydrocarbon groups. The hydrocarbon groups may contain nitrogen and oxygen. The compounds have boiling points up to about 220° C.

More specifically, the NitrosAmine related compounds may have the $R_1$ and $R_2$ groups connected directly or through oxygen, and may be selected from Nitrosopiperidine (NPIP), Nitrosopyrrolidine (NPYR), and Nitrosomorpholine (NMOR), or may be Carmustine where the halogenated hydrocarbon groups are not connected to each other.

In a more specific aspect, the etching agents have a boiling point between about 70° C. and about 220° C. In other more specific aspects, the hydrazine comprises Hydrazine Monohydrate and said hydrazine derivative is selected from the group consisting of HydroxyEthyl Hydrazine (HEH), CyanoEthyl Hydrazine (CEH), ButoxyCarbonylMethyl Hydrazine (BocMH), and ButoxyCarbonylMethoxyEthyl Hydrazine (BocMEH), and a NitrosAmine where the linear or branched hydrocarbon groups are selected from Methyl ($CH_3$), Ethyl ($C_2H_5$), Propyl ($C_3H_7$) or Butyl ($C_4H_9$). In yet still other more specific aspects the NitrosAmine compounds are selected from the group consisting of NitrosoDiMethylAmine (NDMA), NitrosoMethylEthylAmine (NMEA), NitrosoDiEthylAmine (NDEA), NitrosoMethylPropylAmine (NMPA), NitrosoEthylPropylAmine (NEPA), NitrosoDiPropylAmine (NDPA), NitrosoMethylButylAmine (NMBA), NitrosoEthylButylAmine (NEBA), and the NitrosAmine related compounds are selected from the group consisting of Nitrosopyrrolidine (NPYR), Nitrosopiperidine (NPIP), Nitrosomorpholine (NMOR) and Carmustine.

In yet another aspect the invention affords a FIB process and etch assisting agent for etching copper over or adjacent to a dielectric by a focused ion beam, in which process the copper and dielectric are exposed to the ion beam and an etch assisting agent comprising, in combination, a first compound selected from the group consisting of a solution of hydrazine and water, and a hydrazine derivative, the first compound having a boiling point of about 220° C. or lower, and a second compound comprising a strong oxidizer to render sputtered conductive copper non-conductive.

More particularly, the first compound is Hydrazine Monohydrate (HMH) or HydroxyEthylHydrazine (HEH) or a NitrosAmine selected from NitrosoDiMethylAmine (NDMA), NitrosoMethylEthylAmine (NMEA), NitrosoDiEthylAmine (NDEA), NitrosoMethylPropylAmine (NMPA), NitrosoEthylPropylAmine (NEPA), NitrosoDiPropylAmine (NDPA), NitrosoMethylButylAmine (NMBA), and NitrosoEthylButylAmine (NEBA); or a NitrosAmine related compound selected from Nitrosopyrrolidine (NPYR), Nitrosopiperidine (NPIP), Nitrosomorpholine (NMOR) and Carmustine, and the second compound comprises Nitrogen Tetroxide.

In still a further aspect, the invention affords a FIB process for etching copper in the presence of a dielectric by a focused ion beam, in which the copper and dielectric are cooled to a temperature between about −15° C. to about +10° C., and the copper and dielectric are exposed to an etch assisting agent comprising Nitrogen Tetroxide.

DESCRIPTION OF PREFERRED EMBODIMENTS

The invention is particularly well adapted to the focused ion beam (FIB) etching of copper interconnects, power and ground planes and the like in ICs for circuit editing (CE), and will be described in that context. However it will be appreciated that this is illustrative of only one utility of the invention, and that the invention has greater applicability.

Conventional FIB apparatus and operations are well known and will not be described in detail herein. U.S. Pat. No. 7,060,196, which is hereby incorporated by reference herein, discloses FIB apparatus that uses Gallium ($Ga^+$) ions for milling copper over organic dielectrics in a context and environment similar to that of the present invention, and such FIB apparatus may be used to practice the invention.

Although conventional FIB apparatus and processes have typically employed Gallium ($Ga^+$) ions, different metal ions, non-metal ions, noble gas ions and molecular ions may also be used advantageously in FIB processes. For example, other metal ions that may be used include non-radioactive metal ions heavier than Gallium such as: Indium ($In^+$), Mercury ($Hg^+$), Silver ($Ag^+$), Gold ($Au^+$), Cesium ($Cs^+$), Barium ($Ba^+$), Yttrium ($Y^+$), Zirconium ($Zr^+$), Niobium ($Nb^+$), Molybdenum ($Mo^+$), Ruthenium ($Ru^+$), Rhodium ($Rh^+$), Palladium ($Pd^+$), Cadmium ($Cd^+$), Tin ($Sn^+$), Hafnium ($Hf^+$), Tantalum ($Ta^+$), Tungsten ($W^+$), Rhenium ($Rh^+$), Osmium ($Os^+$), Iridium ($Ir^+$), Platinum ($Pt^+$), Thallium ($Th^+$) and Lead ($Pb^+$). Non-metal mono-atomic ions that may be used include Germanium ($Ge^+$), Selenium ($Se^+$), Tellurium ($Te^+$) and Bismuth ($Bi^+$). Noble gas ions that may be used include Helium ($He^+$), Neon ($Ne^+$), Argon ($Ar^+$), Krypton ($Kr^+$) and Xenon ($Xe^+$), and molecular ions that may be used include $NO^{+/-}$, $NO_2^{+/-}$, $N_2O^{+/-}$, $N_2^{+/-}$, $N_2O_4^{+/-}$, $CO^{+/-}$, $CO_2^{+/-}$, $O_2^{+/-}$, $SiO^{+/-}$, $GeO^{+/-}$, $SiO_2^{+/-}$, $GeO_2^{+/-}$.

While the invention will be described herein using FIB process that employ Gallium ions for sputtering copper, it will be appreciated that the invention is not dependent upon the particular ions used in the FIB process, and that other ions such as the ions mentioned above may also be used. From the description and examples that follow, one skilled in the art will be able readily to determine appropriate changes, if any, to the ion beam operating parameters that may be used for the selected ions.

Figure 1:
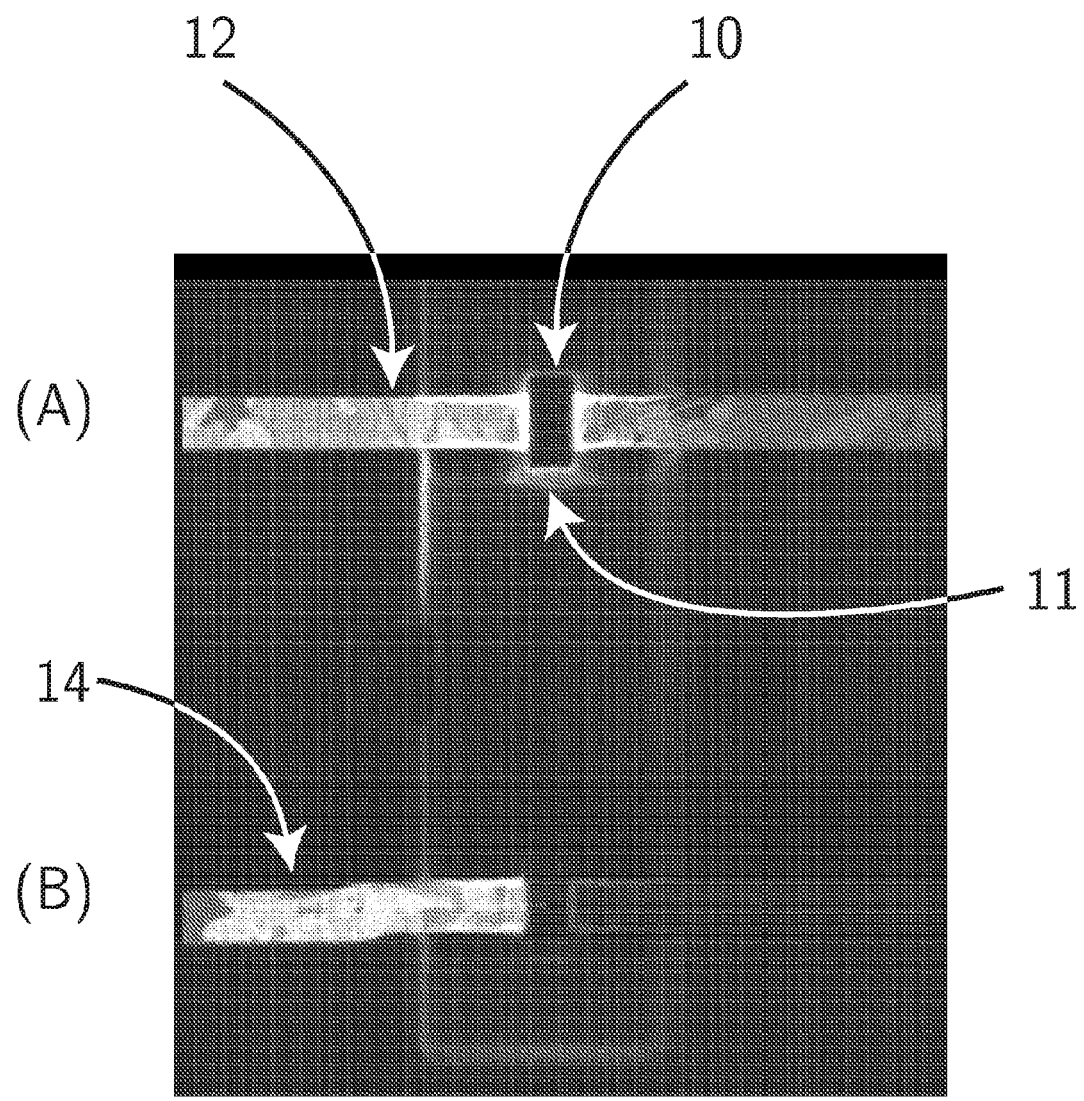
FIG. 1 illustrates the results of milling two copper lines using conventional ion beam etching, the upper copper line in the figure having been etched by straight ion beam sputtering without using any etch assisting agent; and the lower copper line having been milled by ion beam etching in an atmosphere comprising vapors of ammonia, $NH_3$, and water, $H_2O$.
Figure 2:
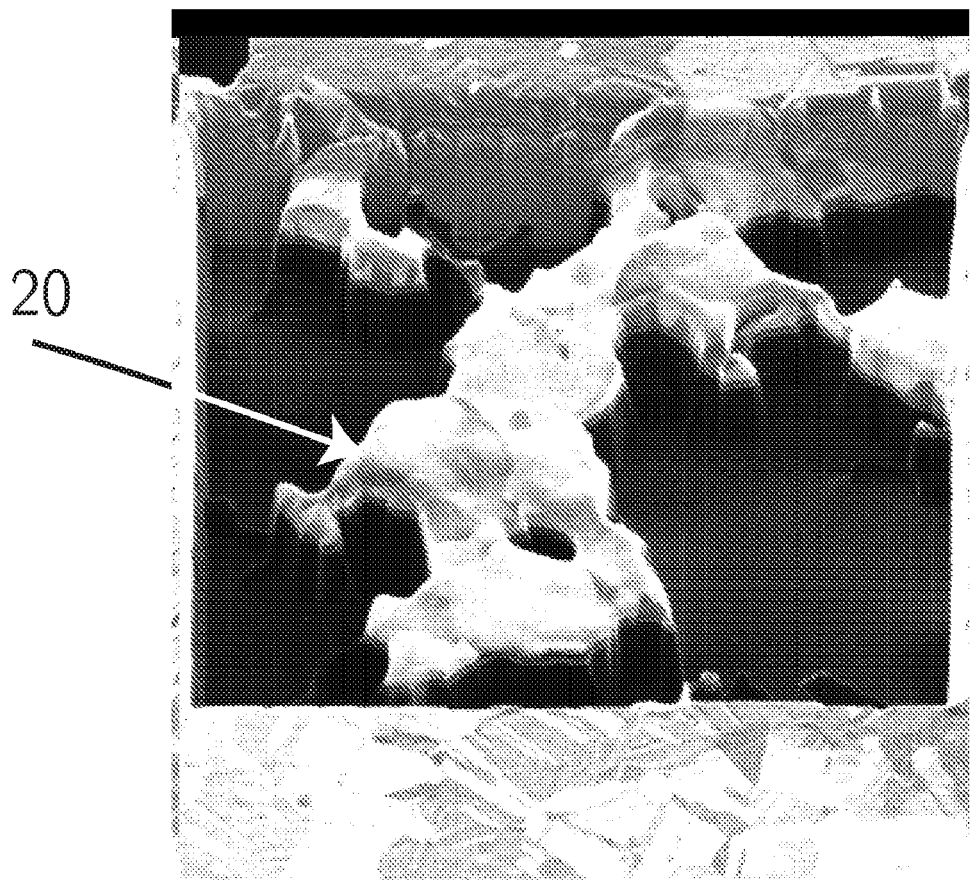
FIG. 2 illustrates the uneven etching of copper by straight ion beam sputtering in an etching agent-free environment.
Figure 3:
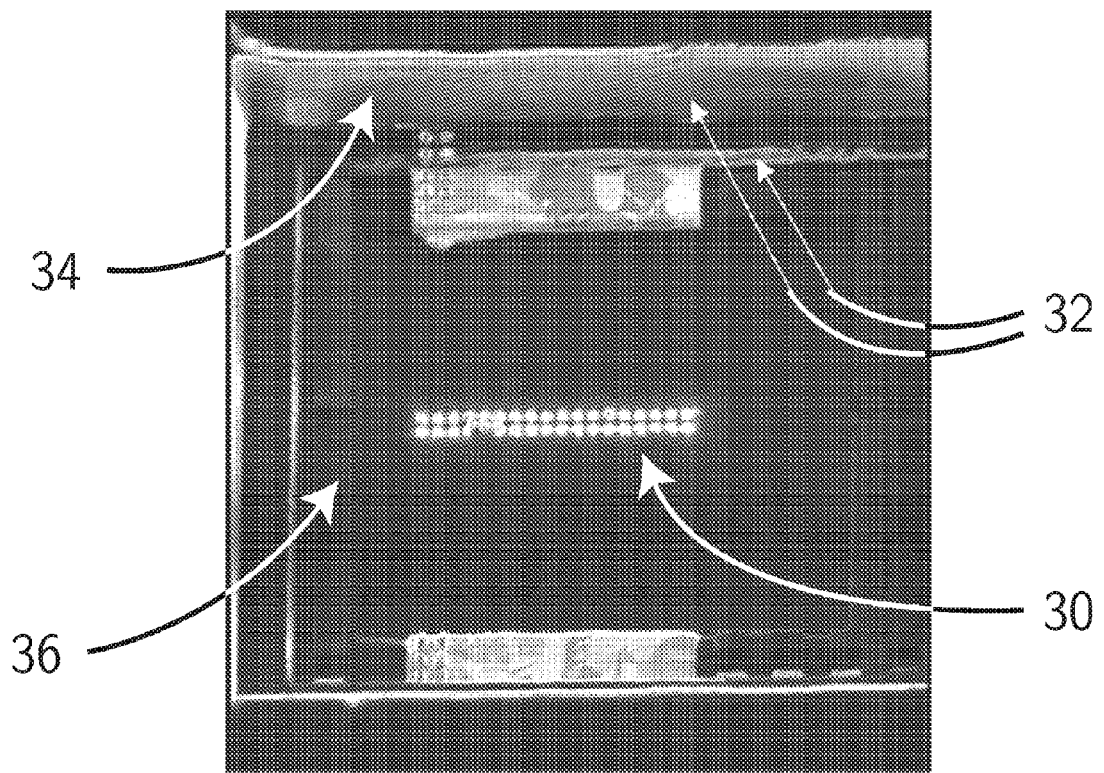
FIG. 3 shows the results of ion beam etching of copper over Black Diamond™ dielectric using Nitro-ethanol as an etch assisting agent.
Figure 4A:
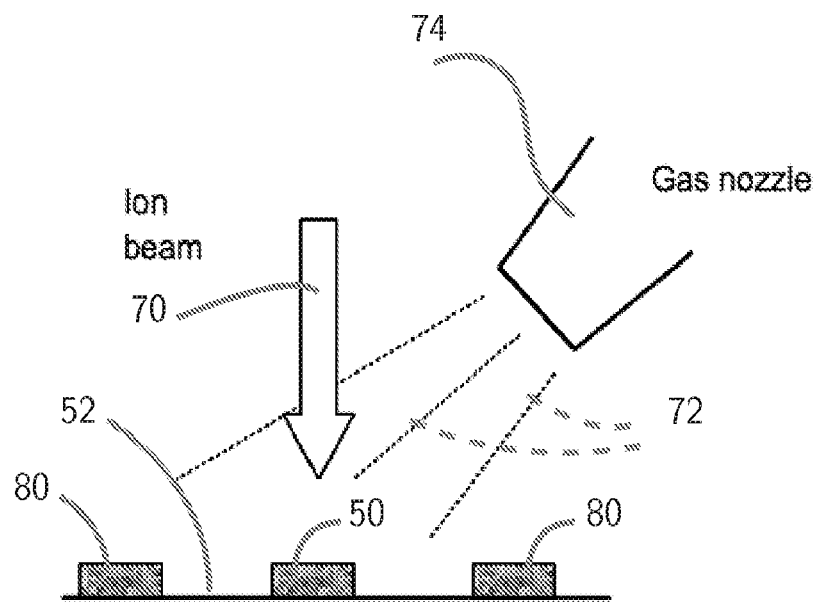
FIGS. 4A-B are diagrammatic views respectively illustrating the FIB etching of copper using a gas etch assisting agent on a planar surface, and in a trench.
Figure 4B:
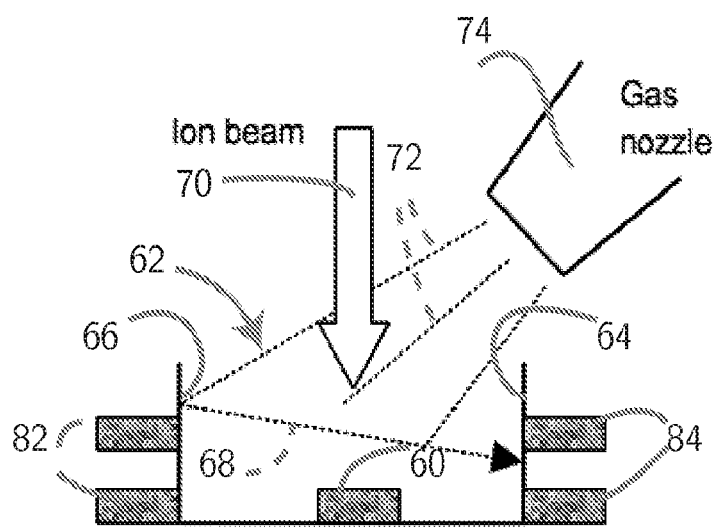

As explained above, the invention affords gaseous etch assisting agents that protect dielectric adjacent to copper against over etching in a FIB etching process, and that oxidize sputtered conductive copper re-deposited in the etching work area to convert it to a non-conductive state. FIGS. 4A-B respectively illustrate diagrammatically the FIB etching of a copper line 50 disposed on a planar dielectric surface 52, and a copper line 60 disposed in a trench 62 having sidewalls 64 and 66. As shown in the figures, an ion beam 70 is directed to the copper lines 50, 60 to be etched, and the copper lines and the adjacent dielectric are exposed to a gaseous etch assisting agent 72 from a gas nozzle 74 located in the FIB chamber adjacent to the ion beam. The gaseous etch assisting agent, as will be described, comprises one or more compounds that are selected both to protect the dielectric and to passivate the sputtered copper through oxidation to render it non-conductive. As used herein, the term "adjacent" in reference to the dielectric means both dielectric that is in the vicinity of the copper as well as dielectric that underlies the copper; and the term "conductive copper" refers both to elemental copper as well as to conductive copper compounds or materials.

As may be appreciated from FIGS. 4A-B, the gas flux delivered to a work area in FIB systems is not very uniform or symmetrical, as the gas nozzle cannot obstruct the ion beam path and must be positioned off to one side. FIG. 4A shows that when copper lines 50, 80 are located on a planar surface 52, the etch assisting gas can easily reach any point on the surface in the area between the copper lines and treat that area, for example, to oxidize re-deposited copper. However, when the copper line to be cut is on the bottom of a trench, for example line 60 in FIG. 4B, which is a very common situation, it may not be possible to achieve direct line of sight from the gas nozzle to the bottom of the trench. There may be shadowed areas (like wall 64 in the figure) where the primary etch assisting gas stream 72 cannot directly impinge. The higher the aspect ratio (depth to width) of the trench, the greater is the shadowing problem. The only opportunity for any significant quantity of the etch assisting gas to reach shadowed areas such as walls or the bottom of the trench is to bounce off of other surfaces, such as wall 64, as indicated at 68 in FIG. 4B. Moreover, other copper lines 82, 84 may be exposed on the vertical walls 64, 66 of the trench, and supplying sufficient etch assisting gas flux to the areas around these copper lines is difficult. If the etch assisting gas is too sticky, i.e., has low volatility and a long residence time, it tends to remain on the walls where it impinges and either does not reach the shadowed areas or does so with low flux. In this case, there may be insufficient reflected gas flux in the shadowed areas to afford the desired processing, e.g., oxidation of re-deposited copper in the shadowed area and protection of the dielectric. Accordingly, by selecting a gas with the appropriate stickiness, bouncing of the etch assisting gas from surfaces to reach shadowed areas can be an effective mechanism for supplying the etch assisting agent to a shadowed work area, either to protect the dielectric or to effect oxidation of re-deposited conductive copper.

Where it is necessary to cut a copper line 60 on the bottom of a trench 62 where other copper lines 82, 84 from other metal layers may be exposed at the trench walls 64, 66, as illustrated in FIG. 4B, copper re-deposition may occur (and very often does) in areas where the etch assisting gas can arrive only indirectly after bouncing from another surface. Sticky etch assisting gases with long residence times on a surface will not be efficiently delivered to such areas as the gas will tend to remain in the spot where it first impinges. On the other hand, the stickier the etch assisting agent, the more efficient it is for protection of the dielectrics against ion beam bombardment. This creates a contradiction. The better the copper etch assisting compound is for protection of the underlying dielectric, the worse it is for oxidation of re-deposited copper, especially in tight, i.e., high aspect ratio ("HAR"), holes.

To address this contradiction, the invention affords more volatile and more aggressive oxidizing copper etch assisting agents having a low number of carbon atoms per molecule. These copper etch assisting agents are used at lower working ion beam current densities in order to promote reasonable dielectric protection. Additionally, the invention provides a combination of different compounds as copper etch assisting agents, one compound being sticky for good protection of dielectrics and the other compound being more volatile and a more aggressive oxidizer to render the sputtered and re-deposited conductive copper non-conductive.

The invention provides etch assisting agents that satisfy both of the two primary requirements of copper etch assisting agents. First, they protect the adjacent dielectric, both conventional and low-k dielectrics, during copper etching. This may be accomplished using etch assisting agent that have low volatility, which implies high boiling point, low vapor pressure, high stickiness, and long residence time when adsorbed on a surface, because efficient protection is afforded by collecting significant amount of the agent on the protected surface. Secondly, the etch assisting agents of the invention afford efficient and continuous oxidation during sputtering and re-deposition of conductive copper onto surfaces adjacent to the work area. Since it is difficult and impractical, following etching, to clean re-deposited copper that is more than one mono-layer thick, the etch assisting agents advantageously oxidize copper both during sputtering and during or immediately following re-deposition as a mono-layer onto adjacent surfaces. This may be accomplished using an etch assisting agent which has good volatility and which is an aggressive and efficient oxidizer, and delivering the agent to adjacent surfaces in sufficient amounts (flux) to oxidize the re-deposited copper rapidly.

If an etch assisting oxidizing gas is too sticky, i.e., has a low volatility due to a high boiling point and low vapor pressure, it has a long residence time when adsorbed on a surface. The gas may not reach re-deposited copper in shadowed areas and will not be effective as an oxidizing agent. Thus, an etch assisting agent that is too sticky will not provide efficient oxidation of the re-deposited copper in holes with a high aspect ratio. Yet, if the etch assisting agent is too volatile (low stickiness), it does not remain on the dielectric surface long enough to prevent dielectric etching.

In accordance with the invention, it has been found that certain classes of compounds protect known dielectrics from sputtering by ions, for example, Gallium ($Ga^+$) ions or other ions that may be used in FIB processes, as will be described, and these classes of compounds are useful as copper etch assisting agents. The distinguishing feature of these classes of compounds provided by the invention is that they contain an N—N bonding (N being nitrogen), which includes hydrazine, hydrazine derivatives, certain NitrosAmines and NitrosAmine related compounds, and Nitrogen Tetroxide. NitrosAmines and NitrosAmine related compounds, as previously described, are compounds where one of the nitrogen atoms in the N—N bonding is saturated with oxygen and the other nitrogen atom is saturated with two hydrocarbon groups, so that the general formula of the compounds can be represented as $R_1N(-R_2)-N=O$, where $R_1$ and $R_2$ are linear or branched hydrocarbon groups or halogenated hydrocarbon groups that may contain oxygen and nitrogen and may connect to each other directly or indirectly (through an oxygen atom, for instance). Due to the presence of N—N or N—N=O fragments in the molecules of the compounds of the invention, when a dielectric is exposed to an ion beam and to the flux of these compounds in a FIB process, the dielectric is protected from etching. Dielectric sputtering is significantly compensated through growing of replacement dielectric by nitrogen (N) from the N—N bonding of the etch assisting agent combining with silicon (Si) from the dielectric or with ions from the ion beam to produce $Si_3N_4$ or, in the case of Gallium ($Ga^+$) ions, GaN, respectively, or by nitrogen and oxygen from the N—N=O bonding of the etch assisting agent combining with silicon and gallium to produce $Si_2N_2O$ and $Ga_3O_3N$, respectively.

Preferred etch assisting compounds of the invention comprise hydrazine ($N_2H_4$) having the structural formula $H_2N-NH_2$ and hydrazine solutions in water of varying concentrations, including Hydrazine Monohydrate (HMH) ($N_2H_4*H_2O$), and hydrazine derivatives which are obtained by the substitution of one or more of the hydrogen atoms with other generally arbitrary groups, e.g., a hydroxyethyl group to produce HydroxyEthylHydrazine (HEH) ($N_2H_3C_2H_4OH$); as well as CyanoEthylHydrazine (CEH) ($C_3H_7N_3$); 1-Boc-1-methyl Hydrazine (N-Boc-N-methyl Hydrazine) (BocMH) (ButoxyCarbonyl Methyl Hydrazine) ($C_6H_{14}N_2O_2$); and 1-N-Boc-1-(2-methoxyethyl) Hydrazine (BocMEH) (ButoxyCarbonyl MethoxyEthyl Hydrazine) ($C_8H_{18}N_2O_3$), which hydrazine solutions and hydrazine derivatives have boiling points of between about 70° C. and about 220° C. The boiling point of CEH is 76-79° C. at 0.5 mmHg, and the boiling point of BocMEH is 80° C. at 0.5 mmHg.

Other preferred compounds of the invention comprise Nitrogen Tetroxide ($N_2O_4$) ($O_2N-NO_2$), NitrosAmine derivatives saturated with linear or branched hydrocarbon groups selected from Methyl ($CH_3$), Ethyl ($C_2H_5$), Propyl ($C_3H_7$) or Butyl ($C_3H_9$), and other related NitrosAmines. Most preferred NitrosAmine derivatives include: DiMethylNitrosAmine (also known as ("aka") NitrosoDiMethylAmine or NDMA) ($C_2H_6N_2O$), MethylEthylNitrosAmine (aka NitrosoMethylEthylAmine or NMEA) ($C_3H_8N_2O$), DiEthylNitrosAmine (aka NitrosoDiEthylAmine or NDEA) ($C_4H_{10}N_2O$), MethylPropylNitrosAmine (aka NitrosoMethylPropylAmine or NMPA) ($C_4H_{10}N_2O$), EthylPropylNitrosAmine (aka NitrosoEthylPropylAmine or NEPA) ($C_5H_{12}N_2O$), DiPropylNitrosAmine (aka NitrosoDiPropylAmine or NDPA) ($C_6H_{14}N_2O$), MethylButylNitrosAmine (aka NitrosoMethylButylAmine or NMBA) ($C_5H_{12}N_2O$), and EthylButyNitrosAmine (aka NitrosoEthylButylAmine or NEBA) ($C_6H_{14}N_2O$). Most preferred NitrosAmine related compounds include: Nitrosopyrrolidine (NPYR) ($C_4H_8N_2O$), Nitrosopiperidine (NPIP) ($C_5H_{10}N_2O$), Nitrosomorpholine (NMOR) ($C_4H_8N_2O_2$), and Carmustine ($C_5H_9Cl_2N_3O_2$). The foregoing NitrosAmine derivatives and NitrosAmine related compounds have boiling points between about 70° C. and about 220° C.

Most preferred compounds that have been found to have reasonably good stickiness for dielectric protection as well as good oxidation efficiency are NitrosoDiMethylAmine (NDMA) ($C_2H_6N_2O$), NitrosoDiEthylAmine (NDEA) ($C_4H_{10}N_2O$), Hydrazine monohydrate (HMH) ($N_2H_4{*}H_2O$) and HydroxyEthylHydrazine (HEH) ($N_2H_3C_2H_4OH$) In addition, for high aspect ratio (HAR) areas where the oxidizing compound should be very mobile, a combination of NDMA or NMEA or NDEA or NMPA or NEPA or NDPA or NMBA or NEBA or HMH or HEH with Nitrogen Tetroxide, $N_2O_4$, may be used. Nitrogen Tetroxide is an extremely powerful oxidizer with a very high vapor pressure (boiling point of 21° C.) which makes it an ideal oxidizing agent for deep holes or other high aspect ratio ("HAR") areas. All the above compounds can be used at reasonably low temperatures of the target IC. Since their volatility decreases with decreasing temperature, their stickiness to the target surface increases, and the temperature of the work area may be controlled to control the etching process, as explained below. In fact, Nitrogen Tetroxide ($N_2O_4$) has particularly advantageous utility at temperatures in the range, for example, of about −20° C. to about +10° C., and more particularly in the range of about −15° C. to about +10° C., that are reasonably close to its melting point of −11.2° C. Since $N_2O_4$ has a solid phase at this temperature, in a temperature range around this temperature increased amounts of $N_2O_4$ can be collected on surfaces of the IC. Therefore, $N_2O_4$ can work both for protection of the dielectric (it has an N—N group and is efficiently collected on surface at low temperatures) and as an oxidizer for re-deposited copper.

The temperature of the IC may be controllably lowered to a desired temperature for FIB copper etching by mounting the IC on a surface of a thermoelectric cooler (so-called Peltier cooler) module in the FIB vacuum chamber to cool the IC. The electrical inputs to the thermoelectric cooler can be controlled to manipulate the temperature of the IC through the Peltier effect to cool the IC to the desired temperature. A thermocouple in the chamber may be used to measure the temperature of the IC. U.S. Patent Publication US 2006/0065853, Mar. 30, 2006, to Chad Rue, which is hereby incorporated by reference herein, discloses such an apparatus and method for manipulating the temperature of a sample in a FIB that may be used for controlling the temperature of the IC during etching.

The following Table 1 gives a comparison of the properties of the preferred copper etch assisting agents of the invention. These agents comprise (i) the NitrosAmines: NDMA, NDEA, NMEA, NMPA, NEPA, NDPA, NMBA and NEBA; (ii) the NitrosAmine related compounds: Nitrosopyrrolidine (NPYR); Nitrosopiperidine (NPIP); Nitrosomorpholine (NMOR); Carmustine; (iii) hydrazine and hydrazine derivatives: Hydrazine Monohydrate (HMH), HydroxyEthylHydrazine (HEH), and Nitrogen Tetroxide. NitroEthanol is included in the Table for reference purposes.

TABLE 1

| | Compound | Volatility | Oxidation Efficiency | Can Be Used Alone in a HAR Hole? | Other |
|---|---|---|---|---|---|
| 1 | NitrosoDiMethylAmine (NDMA) | moderate | good | yes | — |
| 2 | NitrosoDiEthylAmine (NDEA) | moderate | good | yes | — |
| 3 | NitrosoMethylEthlyAmine (NMEA) | moderate | good | yes | — |
| 4 | NitrosoMethylPropylAmine (NMPA) | moderate | good | yes | — |
| 5 | NitrosoEthylPorpylAmine (NEPA) | low | moderate | no | — |
| 6 | NitrosoDiPropylAmine (NDPA) | low | moderate | no | — |
| 7 | NitrosoMethylButylAmine (NMBA) | low | moderate | no | — |
| 8 | NitrosoEthylButylAmine (NEBA) | low | moderate | no | — |
| 9 | Nitrosopyrrolidine (NPYR) | moderate | good | yes | — |
| 10 | Nitrosopiperidine (NPIP) | moderate | moderate | yes | — |
| 11 | Nitrosomorpholine (NMOR) | moderate | moderate | yes | — |
| 12 | Carmustine | moderate | good | yes | — |
| 13 | Hydrazine Monohydrate (HMH) | high/moderate | good | yes | — |
| 14 | HydroxyEthylHydrazine (HEH) | moderate | good | yes | — |
| 15 | CyanoEthylHydrazine (CEH) | low | moderate | no | — |
| 16 | 1-Boc-1-MethylHydrazine (BocMH) | low | moderate | no | — |
| 17 | 1-N-Boc-1-(2-MethoxyEthyl)Hydrazine (BocMEH) | low | moderate | no | — |

TABLE 1-continued

| Compound | Volatility | Oxidation Efficiency | Can Be Used Alone in a HAR Hole? | Other |
|---|---|---|---|---|
| 18 Nitrogen Tetroxide | high | very high | Only at low temperatures near melting point | Expected to be very efficient below about $-11.2°$ C. (melting point) |
| n/a NitroEthanol | low | good | no | — |

The following Tables 2-9 present operating parameters and working examples of FIB copper etching processes employing the foregoing gaseous etch assisting agents in accordance with the invention.

The Gallium ion beam potentials of the FIB are preferably adjusted to be about 30 kV out of the ion column, and the ion beam current is preferably adjusted to a value within the range of the order of about 1 picoAmps (pA) or lower to several tens of nanoAmps (nA) so that ion beam current density is in the recommended range of values for each etch assisting agent, as specified below. The suggested chamber gas pressures and current densities are also listed in the following Table 2 for each of the etching agents of the invention.

TABLE 2

| Copper Etch Assisting Chemistry | Suggested Pressure of the Chemistry (torr) | Suggested Ion Beam Current Density for Etching Copper over $SiO_2$ ($pA/\mu m^2$) | Suggested Ion Beam Current Density for Etching Copper Over Organic Dielectrics ($pA/\mu m^2$) |
|---|---|---|---|
| NDMA, NMEA, NDEA, NMPA, NPYR, Carmustine | $1.0\text{-}3.0 \times 10^{-5}$ | ≤5.0 | ≤3.0 |
| HMH, NPIP, NMOR | $3.0 \times 10^{-5}$ | ≤5.0 | ≤2.0 |
| CEH, BocMH, BocMEH, HEH, NEPA, NDPA, NMBA, NEBA | $3.0 \times 10^{-5}$ | ≤8.0 | ≤4.0 |
| $N_2O_4$ (at an IC Temp. of about $-12°$ C.) | $3.0 \times 10^{-5}$ | ≤3.0 | ≤2.0 |

The values of the parameters in Table 2 may be varied and may assume values within a range of ±30% of the suggested values shown. Time is a parameter that will depend upon the thicknesses of the etched layers.

The following Table 3 gives preferred working parameters when the NitrosAmine and NitrosAmine related compounds, and the hydrazine derivatives HEH, CEH, BocMEH, BocMH and HMH copper etch assisting agents of the invention are used in combination with the oxidizing agent Nitrogen Tetroxide, $N_2O_4$, for both conventional and organic (low-k) dielectrics.

TABLE 3

| Copper Etch Assisting Chemistry With $N_2O_4$ Oxidizing Agent | Preferred Pressure of the Chemistry (torr) | Preferred Pressure of $N_2O_4$ (torr) | Preferred Ion Beam Current Density for Etching Copper over $SiO_2$ ($pA/\mu m^2$) | Preferred Ion Beam Current Density for Etching Copper over Organic Dielectrics ($pA/\mu m^2$) |
|---|---|---|---|---|
| NDMA + $N_2O_4$ | $3.0 \times 10^{-5}$ | $1.0 \times 10^{-5}$ | ≤5.0 | ≤3.0 |
| NDEA + $N_2O_4$ | $3.0 \times 10^{-5}$ | $1.0 \times 10^{-5}$ | ≤6.0 | ≤4.0 |
| NMEA + $N_2O_4$ | $3.0 \times 10^{-5}$ | $1.0 \times 10^{-5}$ | ≤5.0 | ≤3.0 |
| NMPA + $N_2O_4$ | $3.0 \times 10^{-5}$ | $1.0 \times 10^{-5}$ | ≤6.0 | ≤4.0 |
| NEPA + $N_2O_4$ | $3.0 \times 10^{-5}$ | $1.0 \times 10^{-5}$ | ≤6.0 | ≤4.0 |
| NDPA + $N_2O_4$ | $3.0 \times 10^{-5}$ | $1.0 \times 10^{-5}$ | ≤7.0 | ≤4.0 |
| NMBA + $N_2O_4$ | $3.0 \times 10^{-5}$ | $1.0 \times 10^{-5}$ | ≤6.0 | ≤4.0 |
| NPYR + $N_2O_4$ | $3.0 \times 10^{-5}$ | $1.0 \times 10^{-5}$ | ≤6.0 | ≤4.0 |
| NPIP + $N_2O_4$ | $3.0 \times 10^{-5}$ | $1.0 \times 10^{-5}$ | ≤5.0 | ≤3.0 |
| NMOR + $N_2O_4$ | $3.0 \times 10^{-5}$ | $1.0 \times 10^{-5}$ | ≤5.0 | ≤3.0 |
| Carmustine + $N_2O_4$ | $3.0 \times 10^{-5}$ | $1.0 \times 10^{-5}$ | ≤6.0 | ≤4.0 |
| NEBA + $N_2O_4$ | $3.0 \times 10^{-5}$ | $1.0 \times 10^{-5}$ | ≤7.0 | ≤4.0 |
| HMH + $N_2O_4$ | $3.0 \times 10^{-5}$ | $1.0 \times 10^{-5}$ | ≤5.0 | ≤3.0 |
| CEH + $N_2O_4$ | $3.0 \times 10^{-5}$ | $1.0 \times 10^{-5}$ | ≤6.0 | ≤4.0 |
| BocMH + $N_2O_4$ | $3.0 \times 10^{-5}$ | $1.0 \times 10^{-5}$ | ≤5.0 | ≤3.0 |
| BocMEH + $N_2O_4$ | $3.0 \times 10^{-5}$ | $1.0 \times 10^{-5}$ | ≤6.0 | ≤4.0 |
| HEH + $N_2O_4$ | $3.0 \times 10^{-5}$ | $1.0 \times 10^{-5}$ | ≤8.0 | ≤5.0 |

The following Tables 4-9 give working examples and operating parameters for NDMA, NDEA, NPYR, HMH, HEH and CEH, respectively, when used without an oxidizing agent. The sets of parameters in the Tables have been found to produce good results for the different etch assisting chemistries when used with both conventional $SiO_2$ and organic dielectrics.

TABLE 4

Working Examples - NDMA

| Etch Assisting Chemistry Pressure (torr) | Etched Area Size, (um × um) | Ion Beam Current (pA) | Current Density (pA/um2) | Copper Thickness (um) | Dielectric Type | Etching Time (min:sec) |
|---|---|---|---|---|---|---|
| 3.0E−5 | 4 × 4 | 46 | 2.9 | 0.6 | Organic | 8:25 |
| 2.7E−5 | 6.0 × 3.5 | 100 | 4.75 | 1.0 | $SiO_2$ | 13:40 |
| 2.8E−5 | 1 × 1 | 3 | 3.0 | 0.4 | Organic | 5:40 |

TABLE 5

Working Examples - NDEA

| Etch Assisting Chemistry Pressure (torr) | Etched Area Size, (um × um) | Ion Beam Current, (pA) | Current Density (pA/um$^2$) | Copper Thickness (um) | Dielectric Type | Etching Time (min:sec) |
|---|---|---|---|---|---|---|
| 3.1E−5 | 6 × 4 | 116 | 4.8 | 1.0 | $SiO_2$ | 16:20 |
| 2.8E−5 | 5 × 3 | 42 | 2.8 | 0.6 | Organic | 8:35 |
| 2.2E−5 | 1 × 1 | 2 | 2.0 | 0.4 | Organic | 6:40 |

TABLE 6

Working Examples - NPYR

| Etch Assisting Chemistry Pressure (torr) | Etched Area Size, (um × um) | Ion Beam Current, (pA) | Current Density (pA/um$^2$) | Copper Thickness (um) | Dielectric Type | Etching Time (min:sec) |
|---|---|---|---|---|---|---|
| 2.7E−5 | 6 × 4 | 110 | 4.6 | 1.0 | $SiO_2$ | 14:40 |
| 2.6E−5 | 5 × 3 | 45 | 3.0 | 0.6 | Organic | 9:20 |
| 2.9E−5 | 1 × 1 | 3 | 3.0 | 0.4 | Organic | 7:15 |

TABLE 7

Working Examples - HMH

| Etch Assisting Chemistry Pressure (torr) | Etched Area Size, (um × um) | Ion Beam Current, (pA) | Current Density (pA/um$^2$) | Copper Thickness (um) | Dielectric Type | Etching Time (min:sec) |
|---|---|---|---|---|---|---|
| 3.2E−5 | 5 × 5 | 120 | 4.8 | 1.0 | $SiO_2$ | 15:25 |
| 3.0E−5 | 3 × 2 | 20 | 3.3 | 0.6 | Organic | 11:30 |
| 2.9E−5 | 2 × 2 | 10 | 2.5 | 0.4 | Organic | 6:20 |

TABLE 8

Working Examples - HEH

| Etch Assisting Chemistry Pressure (torr) | Etched Area Size, (um × um) | Ion Beam Current, (pA) | Current Density (pA/um$^2$) | Copper Thickness (um) | Dielectric Type | Etching Time (min:sec) |
|---|---|---|---|---|---|---|
| 3.4E−5 | 6 × 6 | 214 | 5.9 | 1.0 | $SiO_2$ | 13:15 |
| 2.8E−5 | 2.5 × 2 | 20 | 4.0 | 0.6 | Organic | 10:30 |
| 3.1E−5 | 1.5 × 1.5 | 10 | 4.4 | 0.4 | Organic | 4:50 |

TABLE 9

Working Examples - CEH

| Etch Assisting Chemistry Pressure (torr) | Etched Area Size, (um × um) | Ion Beam Current, (pA) | Current Density (pA/um$^2$) | Copper Thickness (um) | Dielectric Type | Etching Time (min:sec) |
|---|---|---|---|---|---|---|
| 3.2E−5 | 6 × 6 | 249 | 6.9 | 1.0 | SiO$_2$ | 11:45 |
| 2.9E−5 | 2.5 × 2 | 18 | 3.6 | 0.6 | Organic | 12:10 |
| 3.0E−5 | 1.5 × 1.5 | 11 | 4.9 | 0.4 | Organic | 3:55 |

Since the sputtering rate of copper is proportional to the ion current density, the ratio of the current density to the flux of a particular gaseous etch assisting agent influences both the oxidation of the sputtered and re-deposited copper as well as the protection afforded to the dielectric. If the current density is too high, the gaseous agent does not have sufficient time to adequately oxidize the sputtered and re-deposited copper, and if the gas flux is too low, it may not adequately protect the dielectric. Generally, it is preferable to select a gas flux, and then adjust the current density to give a desired ratio. The values in Tables 4-9 have been found to afford good results for the etch assisting agents tested, and it is expected that such parameters will be appropriate for the other agents of the invention. As may be appreciated, the values are representative values and may be adjusted within ranges about the values given for the specifics of a particular etching operation.

While the foregoing has been with reference to preferred embodiments of the invention, it may be appreciated that changes may be made in these embodiments without departing from the principles and the spirit of the invention, the scope of which is defined in the appended claims.

The invention claimed is:

1. A method of focused ion beam etching of copper in the presence of a dielectric in a focused ion beam vacuum chamber for circuit editing of a microchip, comprising:
    directing a focused ion beam onto the copper to sputter said copper for said circuit editing; and
    exposing the copper and the dielectric to an etch assisting gas comprising a compound selected from the group consisting of Hydrazine Monohydrate, HydroxyEthyl Hydrazine, CyanoEthyl Hydrazine, ButoxyCarbonylMethyl Hydrazine and ButoxyCarbonylMethoxyEthyl Hydrazine, and wherein said compound has a boiling point up to about 220° C., and said etch assisting gas is selected to substantially replenish dielectric sputtered by said ion beam and to render sputtered copper non-conductive during sputtering and re-deposition.

2. The method of claim 1, wherein said compound has a boiling point between about 70° C. and about 220° C.

3. The method of claim 1, wherein said etch assisting gas is one of Hydrazine Monohydrate or HydroxyEthylHydrazine.

4. The method of claim 1, wherein said etch assisting gas further comprises Nitrogen Tetroxide.

5. The method of claim 1, wherein said etch assisting gas is HydroxyEthylHydrazine.

6. A method of focused ion beam etching of copper in the presence of a dielectric in a focused ion beam vacuum chamber, comprising:
    directing a focused ion beam onto a portion of the copper to be etched; and
    exposing the copper to an etch assisting gas comprising a first compound selected to protect the dielectric from etching, the first compound being selected from the group consisting of Hydrazine Monohydrate and a hydrazine derivative, the first compound having a boiling point of about 220° C. or lower, and a second compound comprising Nitrogen Tetroxide to render sputtered conductive copper non-conductive.

7. The method of claim 6, wherein the first compound is selected to have low to moderate volatility to afford a sufficient residence time on the dielectric to replenish dielectric lost due to ion beam etching.

8. The method of claim 6, wherein said copper is located in a high aspect ratio hole that has first surfaces shadowed from direct exposure to the etch assisting gas, and said second compound is supplied such that it bounces from second surfaces on which it impinges directly onto said first surfaces with sufficient flux to oxidize re-deposited copper at said first surfaces.

9. The method of claim 6 further comprising adjusting a ratio of copper etching ion beam current to a flux of the etch assisting gas to oxidize substantially completely sputtered copper that is re-deposited onto surfaces in the vicinity of said etching.

10. The method of claim 6, wherein said first compound is selected from the group consisting of Hydrazine Monohydrate, HydroxyEthyl Hydrazine, CyanoEthyl Hydrazine, ButoxyCarbonylMethyl Hydrazine, and ButoxyCarbonylMethoxyEthyl Hydrazine.

11. The method of claim 6, wherein said dielectric is one of a conventional or a low-k dielectric.

12. A method of focused ion beam etching of copper in the presence of a dielectric in a focused ion beam vacuum chamber, comprising:
    directing a focused ion beam onto a portion of the copper;
    exposing the copper and the dielectric to an etch assisting gas comprising a compound selected from the group of NitrosAmines and NitrosAmine related compounds consisting of NDMA, NMEA, NDEA, NMPA, NEPA, NDPA, NMBA, NEBA NPYR, NPIP, NMOR and Carmustine, said compounds having the chemical structure $R_1N(—R_2)—N=O$, where $R_1$ and $R_2$ are linear or branched hydrocarbon or halogenated hydrocarbon groups.

13. The method of claim 12, wherein said hydrocarbon groups are selected from Methyl, Ethyl, Propyl and Butyl.

14. The method of claim 12, wherein said NitrosAmine related compounds have said $R_1$ and $R_2$ groups connected directly or through oxygen.

15. The method of claim 12, wherein said NitrosAmines are one of NDMA or NDEA.

16. The method of claim 12, wherein said etch assisting gas further comprises an oxidizer having a low boiling point at or below about 21° C.

17. The method of claim 16, wherein said oxidizer comprises Nitrogen Tetroxide.

18. The method of claim 17 further comprising adjusting a copper etching ion beam current relative to a flux of Nitrogen Tetroxide such that sputtered copper is substantially completely oxidized and dielectric sputtered by the ion beam is substantially replenished.

* * * * *